United States Patent
Sun et al.

(10) Patent No.: US 8,582,443 B1
(45) Date of Patent: Nov. 12, 2013

(54) METHOD AND APPARATUS FOR VIRTUAL CABLE TEST USING ECHO CANCELLER COEFFICIENTS

(75) Inventors: Junqing Sun, Santa Clara, CA (US); Danjin Wu, Sunnyvale, CA (US); Xiong Fang, Palo Alto, CA (US); Baohua Chen, Fremont, CA (US); William Lo, Cupertino, CA (US)

(73) Assignee: Marvell International Ltd. (BM)

( * ) Notice: Subject to any disclaimer, the term of this patent is extended or adjusted under 35 U.S.C. 154(b) by 432 days.

(21) Appl. No.: 12/917,748

(22) Filed: Nov. 2, 2010

Related U.S. Application Data

(60) Provisional application No. 61/263,669, filed on Nov. 23, 2009.

(51) Int. Cl.
*H04L 12/26* (2006.01)
*H04B 3/20* (2006.01)

(52) U.S. Cl.
USPC .................. 370/242; 370/286; 370/282

(58) Field of Classification Search
None
See application file for complete search history.

(56) References Cited

U.S. PATENT DOCUMENTS

| | | | |
|---|---|---|---|
| 6,487,179 B1 * | 11/2002 | Leung ..................... | 370/286 |
| 6,825,672 B1 | 11/2004 | Lo et al. | |
| 6,977,507 B1 | 12/2005 | Pannell et al. | |
| 6,980,007 B1 | 12/2005 | Lo et al. | |
| 6,982,557 B1 | 1/2006 | Lo et al. | |
| 6,992,491 B1 | 1/2006 | Lo et al. | |
| 6,995,551 B1 | 2/2006 | Lo et al. | |
| 7,002,353 B1 | 2/2006 | Lo et al. | |
| 7,002,354 B1 | 2/2006 | Pannell et al. | |
| 7,005,861 B1 | 2/2006 | Lo et al. | |
| 7,012,436 B1 | 3/2006 | Pannell et al. | |
| 7,019,533 B1 | 3/2006 | Lo et al. | |
| 7,026,825 B1 | 4/2006 | Lo et al. | |
| 7,068,043 B1 | 6/2006 | Lo et al. | |
| 7,068,044 B1 | 6/2006 | Lo et al. | |
| 7,075,283 B1 | 7/2006 | Lo et al. | |
| 7,106,071 B2 * | 9/2006 | Pharn et al. ................ | 324/539 |
| 7,173,431 B1 | 2/2007 | Lo et al. | |
| 7,190,172 B1 | 3/2007 | Lo et al. | |
| 7,250,771 B1 | 7/2007 | Lo et al. | |
| 7,254,217 B2 * | 8/2007 | Rude et al. ................ | 379/3 |
| 7,276,913 B1 | 10/2007 | Lo et al. | |
| 7,358,745 B1 | 4/2008 | Lo et al. | |
| 7,375,532 B1 | 5/2008 | Lo et al. | |
| 7,403,018 B1 | 7/2008 | Lo et al. | |
| 7,471,670 B1 | 12/2008 | Chen et al. | |
| 7,576,548 B1 | 8/2009 | Lo et al. | |
| 7,627,025 B2 * | 12/2009 | Wang et al. ............... | 375/224 |
| 7,679,371 B1 | 3/2010 | Lo | |
| 7,683,628 B1 | 3/2010 | Lo et al. | |
| 2003/0123399 A1 * | 7/2003 | Zhang et al. ............... | 370/286 |
| 2003/0231761 A1 * | 12/2003 | Zhang et al. ............. | 379/406.01 |
| 2006/0007993 A1 * | 1/2006 | Wang et al. ............... | 375/224 |
| 2006/0182014 A1 * | 8/2006 | Lusky et al. .............. | 370/201 |
| 2009/0252054 A1 | 10/2009 | Barkan et al. | |

OTHER PUBLICATIONS

Marvell Solutions, Transceivers, 88E3015/88E3018 Datasheet, Integrated 10/100 Fast Ethernet Transceiver, Doc. No. MV-S103657-00, Rev. C, Oct. 26, 2006, pp. 1-4 and 39.

* cited by examiner

*Primary Examiner* — Min Jung

(57) ABSTRACT

Systems, methods, and other embodiments associated with echo cancellation are described. According to one embodiment, an apparatus includes a cable tester that determines whether a fault in a cable exists by using echo cancellation values.

17 Claims, 5 Drawing Sheets

METHOD AND APPARATUS FOR VIRTUAL CABLE TEST USING ECHO CANCELLER COEFFICIENTS

CROSS REFERENCE TO RELATED APPLICATIONS

This application claims the benefit of U.S. provisional application Ser. No. 61/263,669 filed on Nov. 23, 2009, which is hereby wholly incorporated by reference.

BACKGROUND

Cable testers are typically used to detect problems in a cable (e.g., a Category 5 cable and so on). For example, a cable tester can perform an analysis of a cable to detect a short, an open, a crossed pair, or a reversed pair within the cable. A short condition occurs when two or more wires within a cable are short-circuited together. An open condition occurs when there is a lack of continuity between ends at both ends of a cable. A crossed pair occurs when a pair of wires within a cable communicates with different pins at each end of the cable. A cable tester can also be used to determine a length of a cable. A cable tester can be coupled to one end of a cable through a first connector (such as an RJ-45 or other connector), and a second end of the cable can be connected to a load through a second connector. Conventional cable testers typically require the load to be a remote node terminator or a loop back module, as conventional cable testers may generate inaccurate results when a cable is terminated by an active link partner that is generating link pulses during a test.

Cable testers can employ time domain reflection (TDR), which is a measurement technique used to determine the characteristics of electrical lines by observing reflected waveforms. The amplitude of the reflected signal can be determined from the impedance of a discontinuity. For example, a cable tester can transmit a test pulse on a cable and measure an elapsed time until a reflection from the cable is received. Using the elapsed time and a cable propagation constant, a distance to a fault within the cable can be estimated. During a cable test, two waves can propagate through a cable—a forward wave that propagates from a transmitter in the cable tester towards the load or fault, and a return wave (or reflection) that propagates from the load or fault to the cable tester.

A perfectly terminated line has no attenuation and an impedance that is matched to a source impedance—i.e., the load is equal to the line impedance. The return wave is zero for a perfectly terminated line because the load receives all of the forward wave energy. For open circuits, the return wave has an amplitude that is approximately equal to the forward wave. For short circuits, the return wave has a negative amplitude that is also approximately equal to the forward wave.

Ethernet network devices such as switches, routers, and network appliances typically include physical layer devices with ports that connect to a cable. Cable tester technology that is implemented with a physical layer device (PHY) of an Ethernet network device allows the PHY to check a quality of a cable connection without the need to unplug the cable, insert a cable tester, and loop back the far ends of the cable.

SUMMARY

In one embodiment an apparatus includes a transmitter configured to transmit signals to a cable and a receiver configured to receive signals from the cable. An echo canceller is connected to the transmitter and the receiver, wherein the echo canceller includes echo coefficients to reduce echo signals from the signals received by the receiver. A cable tester is configured to determine a fault in the cable based on the echo coefficients of the echo canceller.

In another embodiment, a method includes accessing echo cancellation coefficients from a digital signal processor, and analyzing the echo cancellation coefficients to determine a status of a cable operatively connected to the digital signal processor. The method generates a signal that represents the status of the cable.

In another embodiment, a digital signal processor comprises a transmitter for transmitting signals to a cable, a receiver for receiving signals from the cable, and an echo cancellation circuit. The echo cancellation circuit is configured to determine echo cancellation coefficients that model an impulse response of interference signals received by the receiver. The digital signal processor also includes a cable tester that determines whether a fault exists in the cable based at least in part on the echo cancellation coefficients.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. It will be appreciated that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Described herein are example systems, methods, and other embodiments associated with testing for cable faults. In one embodiment, a physical layer device is configured to detect a fault in the cable by analyzing echo cancellation coefficients.

Figure 1:
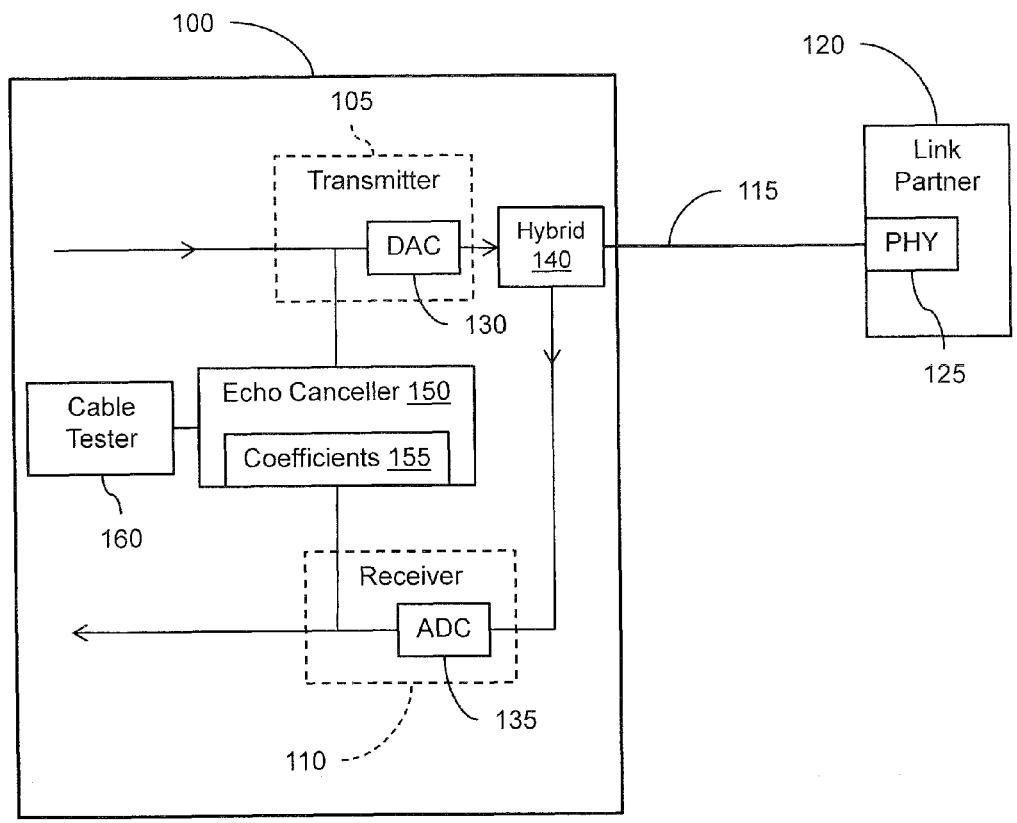
FIG. 1 illustrates one embodiment of an apparatus that includes a cable tester.

With reference to FIG. 1, one embodiment of an apparatus 100 is shown that is configured to detect faults in a cable (also referred to herein as "cable faults"). The apparatus 100 may be a physical layer device (e.g., Ethernet PHY), a digital signal processor (DSP), a transceiver, a network communication device, and so on. The apparatus 100 includes a transmitter 105 and a receiver 110 that are configured for connection to a cable 115 via a port. Communication lines through the transmitter 105 and the receiver 110 define a transmission path and a receiving path, respectively. The cable 115 can be used to connect the apparatus 100 to a remote device (link partner 115) that includes a PHY 125. The transmitter 105 includes a digital-to-analog converter (DAC) 130 for converting outgoing transmission signals to analog form. The receiver 110 includes an analog-to-digital converter (ADC) 135 for converting incoming analog signals to digital form.

In one embodiment, the apparatus 100 is implemented on a chip including one or more integrated circuits or other logic components configured to perform one or more of the functions described herein. The apparatus 100 may be implemented in an electronic device (e.g., computer, laptop, printer, hand held device, and so on) that can be connected to a cable and be able to communicate with a link partner.

In one embodiment, the transmitter 105 and receiver 110 are connected to a hybrid circuit 140. The hybrid circuit 140 controls access to the communication channel (e.g., cable 115 with four twisted pair wires) for full-duplex bi-directional operation over the twisted pair cable.

To compensate for echo signals that may appear in the apparatus 100, the apparatus 100 includes an echo canceller 150 connected to the transmitter 105 and the receiver 110. In one embodiment, the echo canceller 150 includes echo coefficients 155 that are used to cancel or at least reduce echo signals. This will be described in more detail below. In one embodiment, the plurality of echo coefficients 155 are maintained in a finite impulse response (FIR) filter with a plurality of taps. In some embodiments, the echo coefficients 155 may be implemented in one or more shift registers, a look-up table, or other storage/memory device.

The apparatus 100 also includes a cable tester 160 connected to the echo canceller 150. The cable tester 160 is configured to determine/detect a cable fault in the cable 115 using the echo coefficients 155 from the echo canceller 150. By using the echo cancellation coefficients 155, a separate test pulse does not need to be transmitted over the cable and thus the apparatus 100 can check the status of the cable without breaking or interrupting the communication link. As will be further described below, determining whether a cable fault exists based on the echo coefficients 155 may provide a more accurate or more sensitive detection mechanism for minor cable faults.

With reference to echo cancellation, a general description is as follows. As data is transmitted from the transmitter 105 through the cable 115, discontinuities in the cable 115 may cause a signal to be reflected back (echo signal) to the apparatus 100. The echo signals are then received by the receiver 110 along with actual data signals and may distort the data signals.

Echo cancellation involves recognizing the originally transmitted signal that re-appears, with some delay, in the transmitted or received signal. Once the echo is recognized, the echo can be removed by "subtracting" the echo from the transmitted or received signal. This technique is generally implemented using a digital signal processor (DSP), but in some embodiments can also be implemented in software, or both. Echo cancellation may be performed using echo suppressors, echo cancellers, or in some cases both. Initial echo cancellation coefficients 155 may be generated from observed tests that include transmitting known test patterns through a communication link and comparing received signals to the transmitted patterns. Certain differences between the transmitted signals and the received signals can be attributed to echo signals and corresponding cancellation coefficients are generated for cancelling out the echo signals. In some embodiments, an adaptive filter (FIR) may be used to modify the coefficients during operation of the apparatus 100 based at least in part on observed signal comparisons.

The apparatus 100 is not limited to any particular type or implementation of the echo canceller 150. The apparatus 100 is not limited to the example echo canceller 150 discussed herein but can be implemented with other configurations, which include echo cancellation coefficients.

Figure 2:
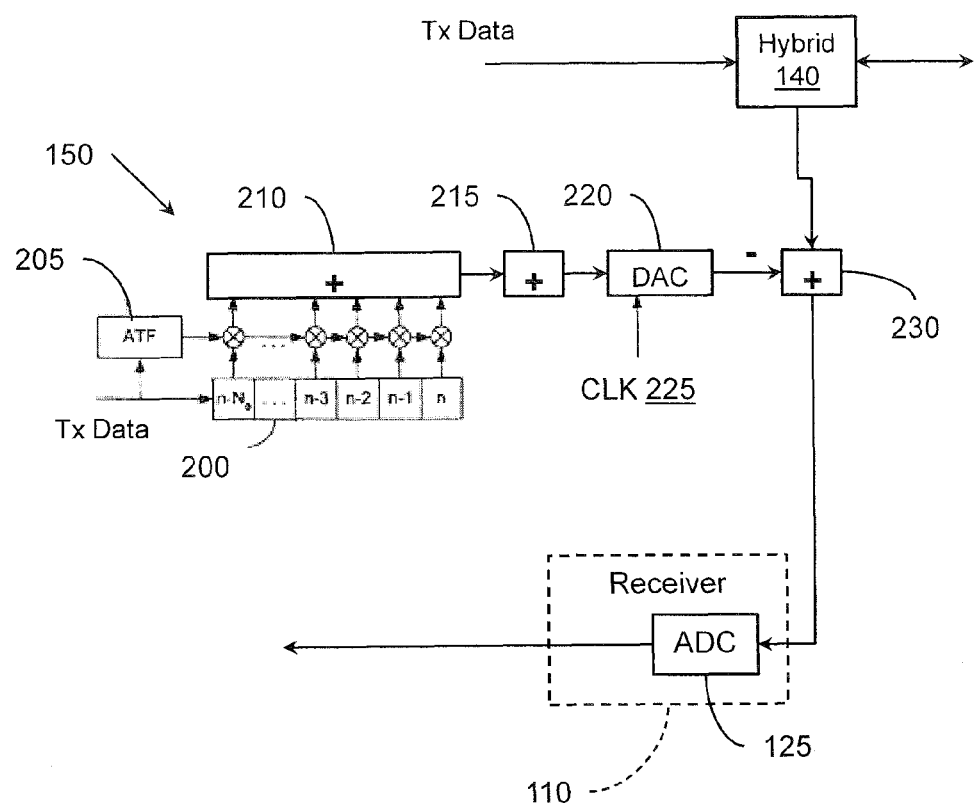
FIG. 2 illustrates one embodiment of an echo canceller.

With reference to FIG. 2, one embodiment of the echo canceller 150 is shown. For example, the echo canceller 150 includes a shift register 200, an adaptive cancellation filter ATF 205, and a combiner 210. Shift register 200 receives transmission data symbols TxData. The shift register 200 can have a size ($N_e$) equal to a length of the echo canceller 150. Adaptive cancellation filter 205 produces echo cancellation coefficients that model impulse responses of the echo interference signal encountered by the receiver 110. A digital replica of the echo interference signal encountered by the receiver 110 is generated by multiplying the echo cancellation coefficients with data symbols TxData and summing the results through the combiner 210. The adaptive cancellation filter 205 may be implemented as an adaptive transversal filter (ATF) using, for example, the least mean squares (LMS) algorithm. The digital replica of the echo interference signal can be sent to combiner 215 and to a digital-to-analog converter DAC 220. The DAC 220 can be clocked with clock signal 225 to ensure that echo interference signals are properly cancelled out at subtracter 230 (applied to the received analog signals from the hybrid circuit 140). Timing delays that may be associated with the generation of the digital replica of the echo interference signal may be compensated for by appropriate time domain manipulations of the digital replica interference signal.

As previously discussed, impedance mismatches along a cable cause signal reflections on cables. To cancel these reflections, echo canceller coefficients of corresponding locations along the cable are determined and adapted. The coefficient value associated with a particular location along the cable is determined by the severity of the impedance mismatch at that location. For example, the severity of the impedance mismatch is determined based on the amplitude of the echo signal received from the cable location. The coefficients are then stored in the shift register 200 where one coefficient is stored in one tap. The shift register 200 may have a desired number of taps (e.g., 96 or more) where each successive tap/coefficient is associated with the next location along the cable where an impedance mismatch was found.

Figure 3:
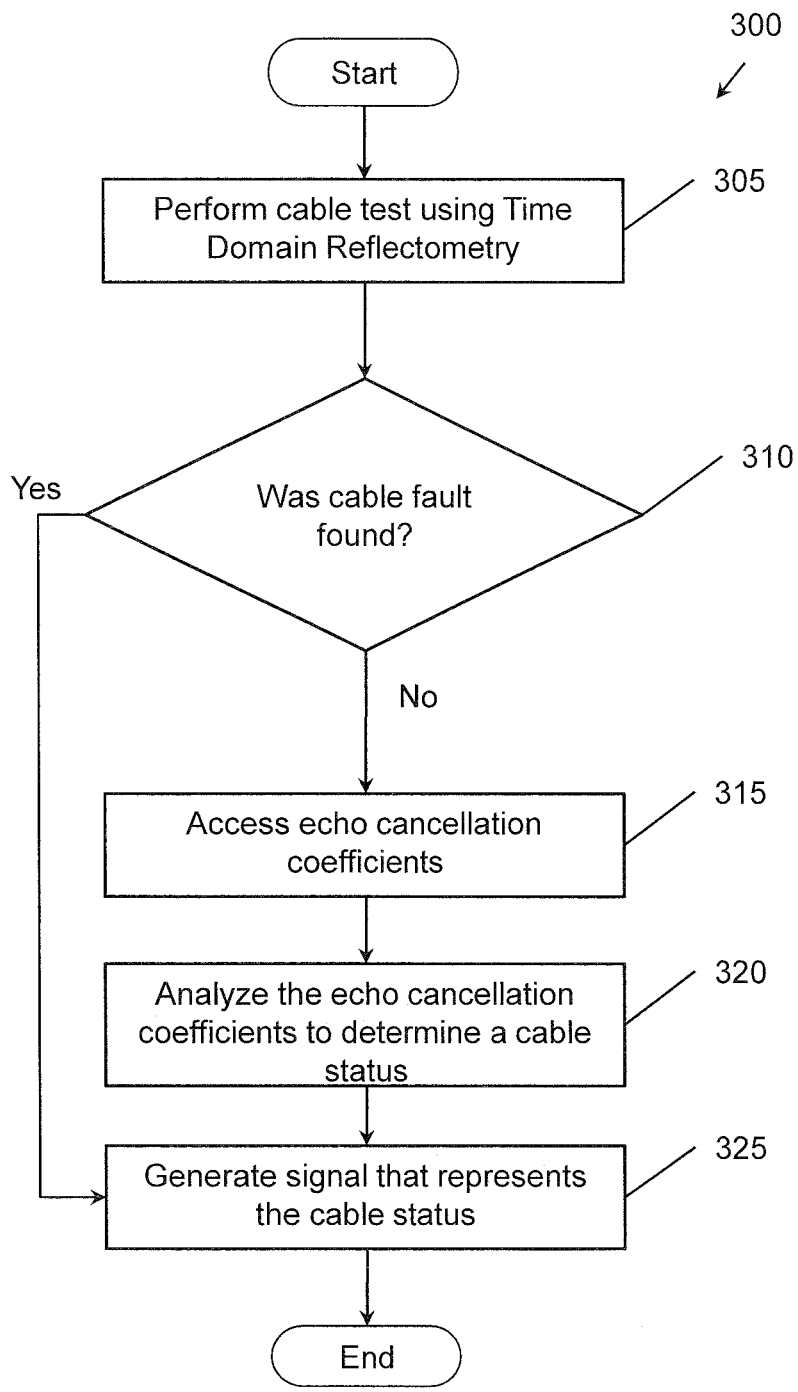
FIG. 3 illustrates one embodiment of a method for testing for cable faults using two techniques.

With reference to FIG. 3 and FIG. 1, in another embodiment, the apparatus 100 may include a Time Domain Reflectometry (TDR) cable tester (not shown) in addition to the cable tester 160. FIG. 3 illustrates one embodiment of a method of testing for cable faults using both testing techniques. With this combination of testers, the cable tester 160 is used to enhance the accuracy of the TDR cable tester.

In one embodiment, at 305, a cable test is first performed using the TDR cable tester along one or more of the cable twisted pairs. This includes transmitting a test pulse on the cable and receiving a reflection signal. Time domain reflectometry is then used to analyze the reflection signal. At 310, the method determines if a cable fault is detected based on predetermined thresholds. The details of time domain reflectometry are outside the scope of the present disclosure and will not be described in detail.

At 315, if a cable fault is not found, it may mean that no fault exists or a fault was too small to be detected by the TDR method. In this case, the cable tester 160 is then executed to find cable faults that were not (or could not be) found by the TDR technique. At 315, the echo cancellation coefficients are accessed from the apparatus 100 (e.g., a digital signal processor). At 320, the echo cancellation coefficients are analyzed to determine a cable status of the cable operatively connected to the digital signal processor. At 325, a signal is generated that represents the cable status (e.g., OK (no fault), short, open) based at least in part on the analysis.

At 310, if a cable fault is found using the Time Domain Reflectometry test, then the method passes to 325 where a signal is generated representing the status. Hence, the second cable test may be by-passed and not performed.

In one embodiment, the analyzing at 320 may include analyzing the echo cancellation coefficients to determine a plurality of peaks from the reflected echo signals along the cable. For example, the plurality of peaks may include a near end peak that is a peak near a connection between the digital signal processor and the cable, and a tail end peak that is a peak some distance from the near end peak. An amplitude of the tail end peak may be determined and compared to a threshold(s). In another embodiment, the method may remove drifting for the tail end peak. The cable status is then determined based at least in part on the comparison result. The threshold(s) can be generated from observed cable characteristics and expected peak amplitudes associated with certain distances. For example observed results can be obtained from non defective cables that represent an expected tail end peak (second peak) at certain cable distances. If, from the echo coefficients, the second peak is found with a value that meets or exceeds a threshold associated with a distance from the near end, this condition may represent a cable fault. This will be described in more detail below.

Figure 4:
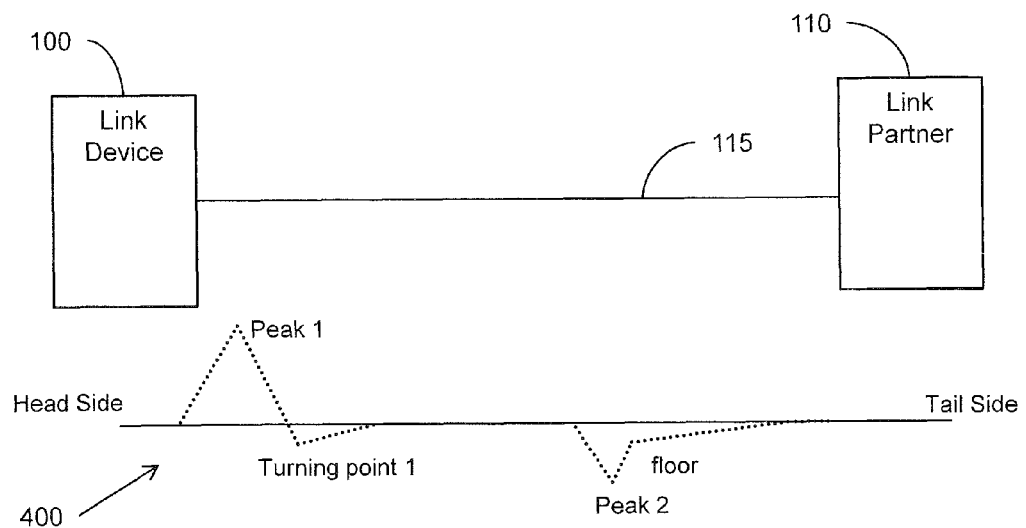
FIG. 4 illustrates one example of a shape of echo cancellation coefficients.

With reference to FIG. 4, techniques and algorithms for finding peaks from the echo coefficients are described. FIG. 4 illustrates an example diagram 400 that shows an example shape (represented by the dotted line) of coefficient values. As shown in FIG. 4, well adapted echo coefficients should have two (2) peaks, named peak1 (first peak) and peak2 (second peak), that may occur over the cable 115. Coefficients associated on the left side of the first peak (peak1) correspond to cable impedance near the link device 100, which is the device performing the cable test. Finding the exact locations and peak values of the two peaks provide for more accurate detection of the impedance and location of cable faults along the cable 115. As the second peak (peak2) is more attenuated by the cable 115, the second peak is more difficult to be correctly detected.

Algorithms for Finding the First Peak (Peak1)

In one embodiment, the echo coefficients are analyzed to identify the first peak (peak 1) from the head side to the tail side of the cable 115. The echo canceller 150 (shown in FIG. 1) stores the echo cancellation coefficients 155 according to distance from the head side. For example, if there are 100 taps (0-99) that store coefficients, tap 0 is the echo coefficient nearest to the head side along the cable and tap 99 is associated with the furthest distance from the head side. An echo coefficient that may qualify as the first peak (peak1) should meet the following conditions: (1) the first peak is located between a certain range of coefficient locations (e.g., closer to the head side); (2) the first peak is a peak (e.g., neighbor coefficients either have different signs or amplitudes are smaller); and (3) (a) an amplitude of the first peak should also be larger than a certain predetermined threshold (e.g., to eliminate small peaks), or (b) the relative amplitude of the first peak to the previous coefficient is larger than a threshold. The amplitude is evaluated using the absolute value of the coefficient. Finding peak values may include comparing neighboring echo coefficient values to identify high points, low points, and transition points (e.g., turning points: going from increasing values to decreasing values or vice versa).

Detection of the Second Peak (Peak2)

In one embodiment, the echo coefficients are analyzed to identify the second peak (peak2). The process searches for the second peak (peak2) from the tail side to the head side. The echo coefficients are analyzed to find peak values of reflections and their distance, which will determine whether a cable fault exists or not. The second peak (peak2) is divided into two possible types: type I is a flat peak (e.g., a smooth, more rounded transition at peak like a hill shape) and type II is sharp peak (e.g., point-like shape at peak). The second peak (peak2) is considered to be found if either type is detected.

In one embodiment, finding a type I peak (flat) includes finding the echo coefficient that matches the following conditions: (1) it is a peak; (2) its height should be larger than a certain predefined threshold; (3) its height should be bigger than another threshold determined by the biggest differences between neighbor coefficients on its right side (toward the tail side); and (4) the echo coefficient should be a certain distance away from the head side. As stated previously, typical cable responses and characteristics may be predetermined from testing known cables. Based on these observations, the second peak (peak2) can be expected to have a certain amplitude and be between certain distances along the cable (measured by thresholds). Finding the second peak (peak2) outside the amplitude thresholds generates a cable fault signal.

In one embodiment, finding a type II peak (sharp) includes finding the echo coefficient that matches the following conditions: (1) it is a peak; (2) its width is less than a threshold; and (3) its height should also be larger than certain predetermined threshold (determined from observed tests).

The peak width may be counted as follows. From the tail side to the head side, all points where the coefficients increase/decrease direction change are defined as turning points. The tail is considered as a turning point. A turning point is used as a floor for the turning points on their left side to calculate the peak amplitude. The distance between the turning point and its floor is considered as the width of this peak. The signed amplitude difference between the turning point and its floor is taken as the height of the peak. After each turning point, a counter is used to count the distance from the tail side to the head side.

As shown in FIG. 4, coefficients may increase or decrease to the same direction slowly (drifting) before a real peak starts. The following algorithm may be used for removing the drifting. After a turning point, the points are not considered as a floor until the following conditions are both broken: (1) neighbor coefficient difference is less than a threshold; and (2) sum of difference is also less than a threshold.

Determining a Condition of a Cable

Figure 5:
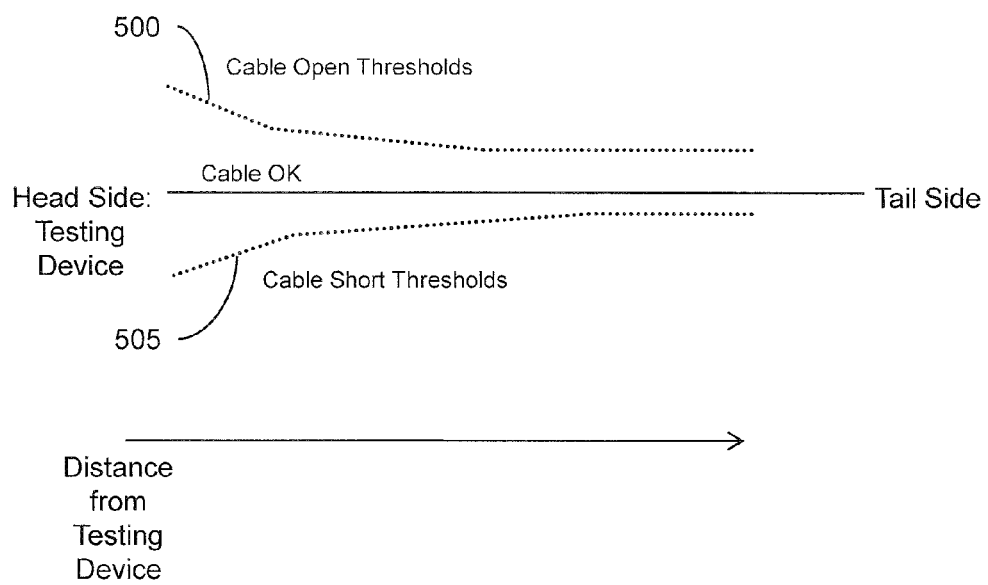
FIG. 5 illustrates one embodiment of cable thresholds to detect a fault.

With reference to FIG. 5, once the peaks are found, the condition of the cable can be determined. For example, a cable fault location is calculated by multiplying a constant to the distance between the first peak (peak1) and the second peak (peak2). The amplitude of the second peak (peak2) is compared to predetermined thresholds to determine the cable status including open, OK, or short. The thresholds may vary according to the distance between peak 1 and peak 2 from the head side to the tail side. For example, FIG. 5 illustrates example threshold values for a cable open condition 500 and a cable short condition 505. The thresholds represent amplitude thresholds associated with a fault condition at various distances from the head side to the tail side along the cable. The cable open thresholds 500 may be represented as positive values and the cable short thresholds 505 may be represented as negative values. TDR uses a similar approach, but the value to be compared is the impulse amplitude instead of echo canceller coefficients. In one embodiment, if an echo coefficient is found to meet or exceed the threshold 500 or 505, a fault condition signal is generated.

A status of "open" is determined if the second peak (peak2) amplitude (at its associated distance from the head side) is larger than the positive threshold 500 at that distance. A status of "short" is determined if the second peak (peak2) amplitude is less than the negative threshold 505 at the corresponding distance. A status of "OK" (no fault, normal condition) is determined if the second peak (peak2) amplitude is between the positive and negative thresholds 500 and 505.

With the described apparatus, methods, and equivalent embodiments, a cable fault may be detected by analyzing echo cancellation coefficients. This may provide a more accurate or more sensitive mechanism for detecting faults than using time domain reflectometry. Since the echo cancellation coefficients exist in the echo canceller, a cable test may be performed at any time without having to interrupt the communication link.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
   a transmitter configured to transmit signals to a cable;
   a receiver configured to receive signals from the cable;
   an echo canceller connected to the transmitter and the receiver, wherein the echo canceller includes echo coefficients to reduce echo signals from the signals received by the receiver; and
   a cable tester configured to analyze the echo coefficients from the echo canceller to determine a plurality of peaks from the echo coefficients, wherein the plurality of peaks include (i) a near end peak that is a peak near a connection between the apparatus and the cable, and (ii) a tail end peak that is a peak some distance from the near end peak;
   wherein the cable tester is configured to determine a status of the cable by comparing an amplitude of the tail end peak to a threshold, wherein the status of the cable includes a normal status, a short status, or an open status.

2. The apparatus of claim 1, wherein the echo canceller comprises a plurality of taps, wherein each tap stores a corresponding echo coefficient associated with an echo signal, wherein the echo signal is received from the cable by the receiver in response to the transmitter having transmitted a signal to the cable.

3. The apparatus of claim 2, wherein the echo canceller comprises a filter adapter that modifies the echo coefficients in the plurality of taps based at least in part on error signals determined from cancelling echo signals.

4. The apparatus of claim 1, wherein the apparatus is a physical layer device.

5. The apparatus of claim 1, wherein the apparatus further comprises:
   a time domain reflectometry (TDR) cable tester configured to transmit a test pulse through the cable and determine a status of the cable from received reflected signals; and
   wherein the apparatus is configured to perform a first cable test using the TDR cable tester, and if a fault in the cable is not found by the TDR cable tester, then the apparatus is configured to perform a second cable test by analyzing the echo coefficients with the cable tester.

6. A method, comprising:
   accessing echo cancellation coefficients from a digital signal processor;
   analyzing the echo cancellation coefficients to determine a status of a cable operatively connected to the digital signal processor, wherein the analyzing includes determining a plurality of peaks from the echo cancellation coefficients, wherein the plurality of peaks include (i) a near end peak that is a peak near a connection between the digital signal processor and the cable, and (ii) a tail end peak that is a peak some distance from the near end peak;
   determining an amplitude of the tail end peak and comparing the amplitude to a threshold, wherein the status of the cable is determined based at least in part on the comparison; and
   generating a signal that represents the status of the cable.

7. The method of claim 6, wherein the analyzing comprises:
   removing drifting from the tail end peak.

8. The method of claim 6, wherein the analyzing determines the status of the cable to be a normal condition, a short condition, or an open condition.

9. The method of claim 6, wherein accessing echo cancellation coefficients includes processing the echo cancellation coefficients from a plurality of taps from an echo cancellation circuit.

10. The method of claim 6, wherein the status of the cable is determined based at least in part on an amplitude of the tail end peak relative to the threshold and a distance of the tail end peak from the near end peak along the cable.

11. The method of claim 10, wherein determining the status of the cable includes comparing the distance of the tail end peak from the near end peak to a distance threshold associated with the fault condition.

12. The method of claim 6, further comprising prior to the accessing and the analyzing:
- transmitting a test pulse on the cable and receiving a reflection signal;
- detecting whether a fault in the cable is present by processing the reflection signal using time domain reflectometry; and
- if the fault in the cable is not detected, then performing the accessing and analyzing of the echo cancellation coefficients to determine the status of the cable.

13. A digital signal processor comprising:
- a transmitter for transmitting signals to a cable;
- a receiver for receiving signals from the cable;
- an echo cancellation circuit configured to determine echo cancellation coefficients that model an impulse response of interference signals received by the receiver; and
- a cable tester configure to determine whether a fault exists in the cable based at least in part on the echo cancellation coefficients, wherein the cable tester is configured to analyze the echo cancellation coefficients from the echo cancellation circuit to determine a plurality of peaks from the echo cancellation coefficients, wherein the plurality of peaks include (i) a near end peak that is a peak near a connection between the transmitter and the cable, and (ii) a tail end peak that is a peak found at a distance along the cable from the near end peak;
- wherein the cable tester is configured to determine a status of the cable by comparing an amplitude of the tail end peak to a threshold and comparing the distance to a distance threshold, wherein the status of the cable includes a normal status, a short status, or an open status.

14. The digital signal processor of claim 13, wherein the cable tester is configured to determine a signal peak of the interference signals from the echo cancellation coefficients, and wherein the fault in the cable is determined based at least in part on an amplitude of the signal peak and a distance along the cable.

15. The digital signal processor of claim 14, wherein the cable tester is configured to determine the fault in the cable by comparing the amplitude of the signal peak to an amplitude threshold associated with a fault condition, and comparing the distance to a distance threshold associated with the fault condition.

16. The digital signal processor of claim 13, where the digital signal processor comprises:
- a time domain reflectometry (TDR) cable tester configured to transmit a test pulse though a the cable and determine a status of the cable from received reflected signals; and
- wherein the digital signal processor is configured to perform a first cable test using the TDR cable tester and if a fault in the cable is not found, then perform a second cable test by analyzing the echo cancellation coefficients with the cable tester.

17. The digital signal processor of claim 13, wherein the cable tester is configured to determine whether a fault in the cable exists by identifying an echo cancellation coefficient that has an amplitude that meets or exceeds a threshold associated with a distance from the digital signal processor.

\* \* \* \* \*